US012573438B2

(12) United States Patent
Wu et al.

(10) Patent No.: US 12,573,438 B2
(45) Date of Patent: Mar. 10, 2026

(54) DEVICE HAVING ROWS OF MRAM CELLS CONFIGURED FOR CONCURRENT WRITING AND READING

(71) Applicant: TAIWAN SEMICONDUCTOR MANUFACTURING COMPANY, LTD., Hsinchu (TW)

(72) Inventors: Jui-Jen Wu, Hsinchu (TW); Jen-Chieh Liu, Hsinchu (TW); Yi-Lun Lu, Hsinchu (TW); Win-San Khwa, Hsinchu (TW); Meng-Fan Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 106 days.

(21) Appl. No.: 18/733,241

(22) Filed: Jun. 4, 2024

(65) Prior Publication Data

US 2025/0239285 A1     Jul. 24, 2025

Related U.S. Application Data

(60) Provisional application No. 63/622,397, filed on Jan. 18, 2024.

(51) Int. Cl.
*G11C 7/00*          (2006.01)
*G11C 11/16*         (2006.01)

(52) U.S. Cl.
CPC ........ *G11C 11/1675* (2013.01); *G11C 11/161* (2013.01); *G11C 11/1655* (2013.01); *G11C 11/1673* (2013.01)

(58) Field of Classification Search
CPC ..... G11C 11/4091; G11C 7/065; G11C 7/062; G11C 7/06; G11C 7/067
USPC ............................................ 365/207, 189.15
See application file for complete search history.

(56) References Cited

U.S. PATENT DOCUMENTS

| | | | | |
|---|---|---|---|---|
| 10,573,374 B2* | 2/2020 | Ishizu | ................. | G11C 11/4099 |
| 11,177,010 B1* | 11/2021 | Lee | ...................... | G11C 17/165 |
| 2023/0352072 A1 | 11/2023 | Kim et al. | | |

FOREIGN PATENT DOCUMENTS

TW          202324800          6/2023

* cited by examiner

*Primary Examiner* — Son T Dinh
(74) *Attorney, Agent, or Firm* — Hauptman Ham, LLP

(57) ABSTRACT

In a matrix of SOT-MRAM cells, a first row is selected for writing and a second row is selected for reading. A first SOT-MRAM cell of the first row and a second SOT-MRAM of the second row are in a first column, while a third SOT-MRAM cell of the first row and a fourth SOT-MRAM of the second row are in a second column. The currents for writing the first SOT-MRAM cell and the third SOT-MRAM cell are in opposite direction. A first sense amplifier is configured to detect a voltage change on the first read bit line which is charged with a first read current in the second SOT-MRAM cell. A second sense amplifier is configured to detect a voltage change on the second read bit line which is discharged with a second read current in a fourth SOT-MRAM cell.

20 Claims, 5 Drawing Sheets

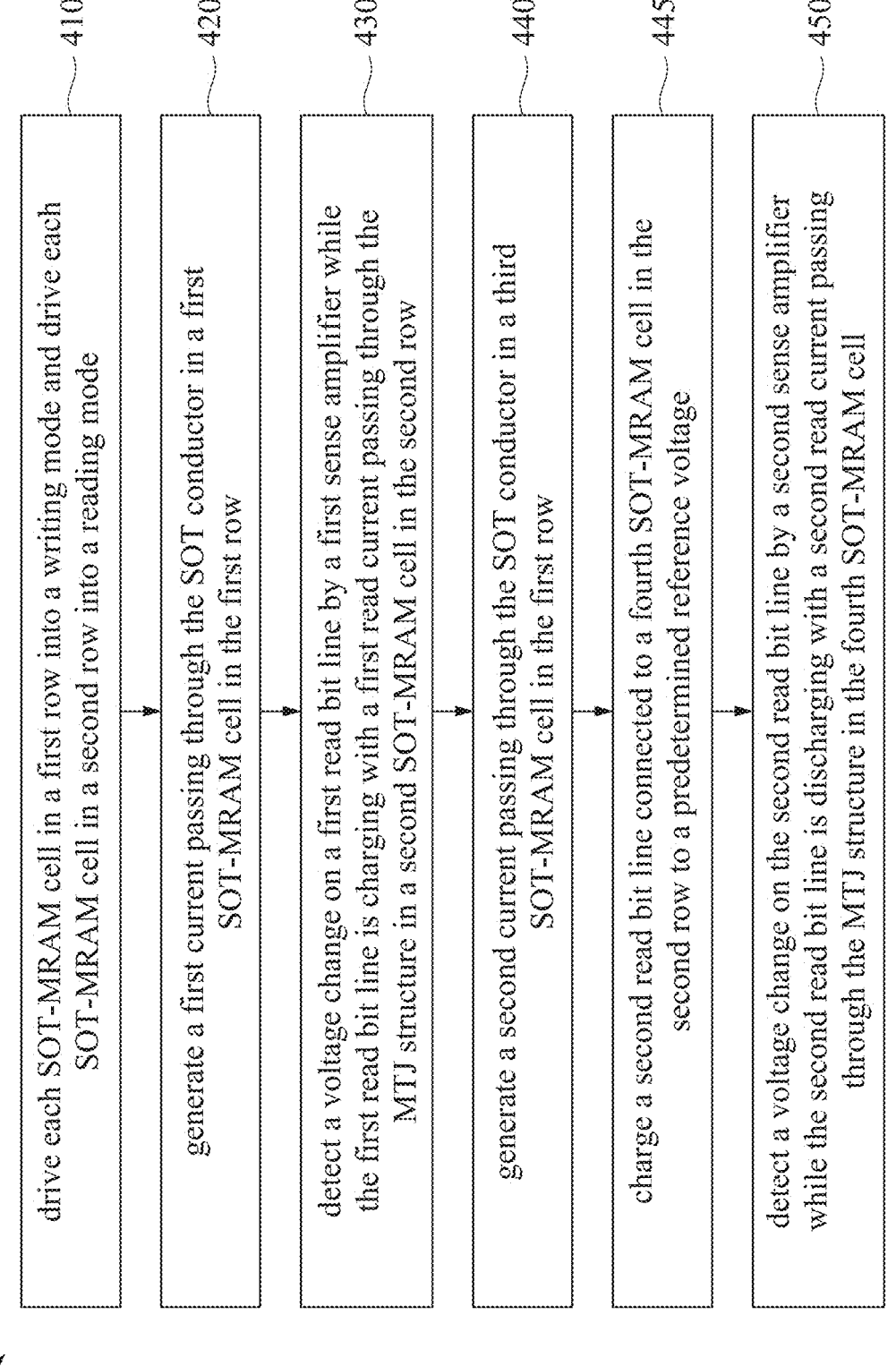

drive each SOT-MRAM cell in a first row into a writing mode and drive each SOT-MRAM cell in a second row into a reading mode — 410 generate a first current passing through the SOT conductor in a first SOT-MRAM cell in the first row — 420 detect a voltage change on a first read bit line by a first sense amplifier while the first read bit line is charging with a first read current passing through the MTJ structure in a second SOT-MRAM cell in the second row — 430 generate a second current passing through the SOT conductor in a third SOT-MRAM cell in the first row — 440 charge a second read bit line connected to a fourth SOT-MRAM cell in the second row to a predetermined reference voltage — 445 detect a voltage change on the second read bit line by a second sense amplifier while the second read bit line is discharging with a second read current passing through the MTJ structure in the fourth SOT-MRAM cell — 450

DEVICE HAVING ROWS OF MRAM CELLS CONFIGURED FOR CONCURRENT WRITING AND READING

PRIORITY CLAIM

This application claims the benefit of U.S. Provisional Application No. 63/622,397, filed Jan. 18, 2024, which is hereby incorporated by reference in its entirety.

BACKGROUND

MRAM ("Magnetoresistive Random Access Memory") is a type of non-volatile memory technology that uses magnetic states to store information. In MRAM, information is stored by manipulating the magnetic orientation of ferromagnetic material. The basic structure of an MRAM cell includes a magnetic tunnel junction, which includes two ferromagnetic layers separated by a tunnel barrier layer. The resistance of the magnetic tunnel junction depends upon the relative alignment of the magnetization of the two ferromagnetic layers. In Spin-Orbit Torque MRAM ("SOT-MRAM"), a conductive layer is deposited near the magnetic tunnel junction in a memory cell, and the flow of an electric current through the conductive layer generates a spin-orbit torque which is used to manipulate a magnetic state of the magnetic tunnel junction of the memory cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 is a flowchart of a method of fabricating a memory device, in accordance with some embodiments.

DETAILED DESCRIPTION

Figures 1A, 1B:
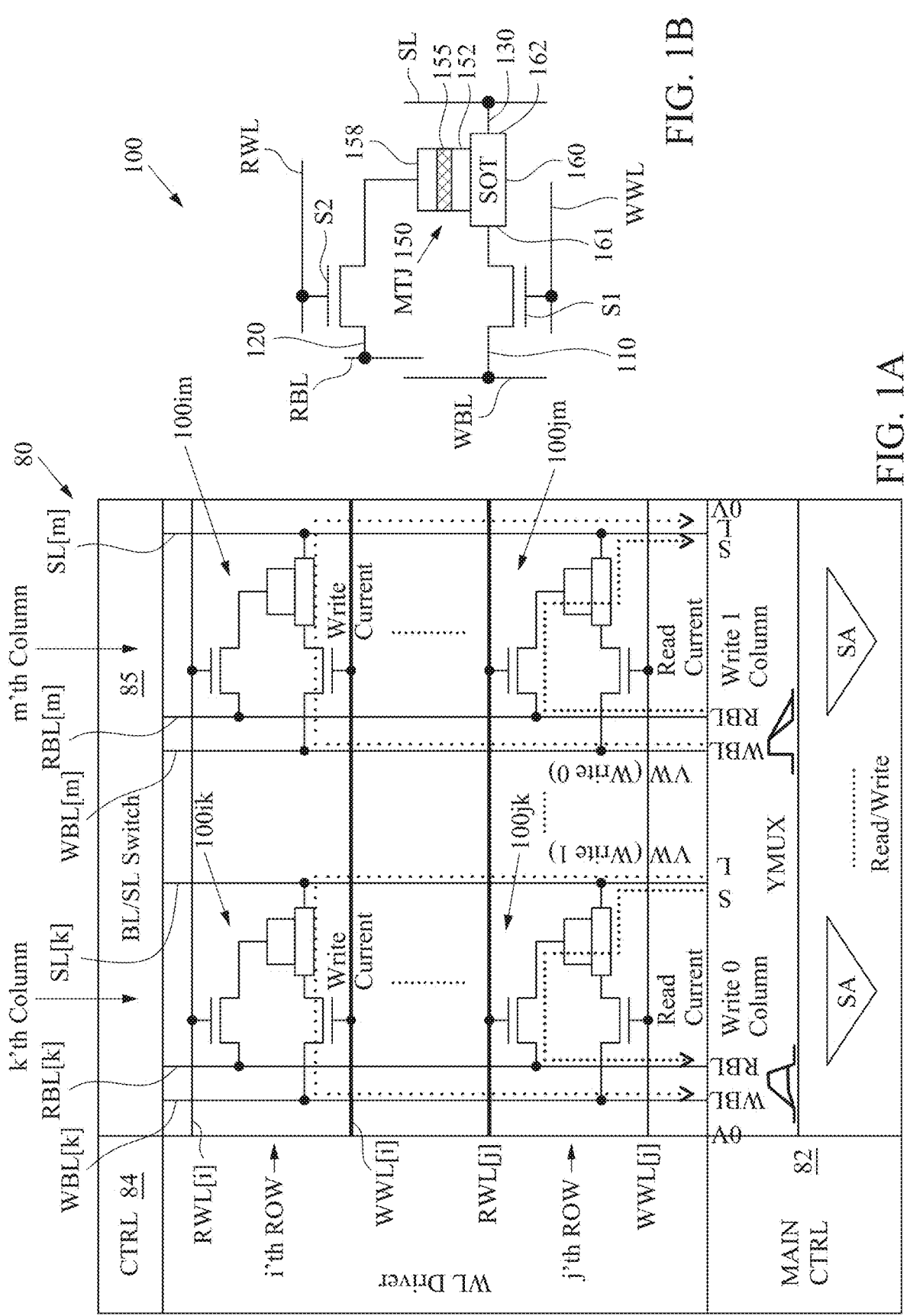
FIG. 1A is circuit diagram of an integrated circuit with SOT-MRAM cells, in accordance with some embodiments.
FIG. 1B is a circuit diagram of an example implementation of one of the SOT-MRAMs used in the integrated circuit of FIG. 1A, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, in a matrix of SOT-MRAM cells, each SOT-MRAM cell has a magnetic tunneling junction ("MTJ") structure and a spin-orbit torque ("SOT") conductor. While each SOT-MRAM cell in a first row is driven into a writing mode and each SOT-MRAM cell in a second row is driven into a reading mode, as a first current is generated to pass through the SOT conductor in a first SOT-MRAM cell in the first row, a first sense amplifier is configured to detect a voltage change on a first read bit line while the first read bit line is charging with a first read current passing through the MTJ structure in a second SOT-MRAM cell in the second row. The first SOT-MRAM cell and the second SOT-MRAM cell are in a first column. Furthermore, as a second current is generated to pass through the SOT conductor in a third SOT-MRAM cell in the first row, a second sense amplifier is configured to detect a voltage change on a second read bit line while the second read bit line is discharging with a second read current passing through the MTJ structure in a fourth SOT-MRAM cell in the second row after the second read bit line is pre-charged by the second sense amplifier. The third SOT-MRAM cell and the fourth SOT-MRAM cell are in a second column. Here, the first current passing through the SOT conductor in the first SOT-MRAM cell and the second current passing through the SOT conductor in the third SOT-MRAM cell are opposite in flow direction.

FIG. 1A is a circuit diagram of an integrated circuit 80 with SOT-MRAM cells, in accordance with some embodiments. In FIG. 1A, the SOT-MRAM cells are arranged in a matrix which has N rows and M columns, where N and M are positive integers (such as, N=1024 and M=4096). One of the SOT-MRAM cells is shown in FIG. 1B as a SOT-MRAM cell 100, which is an example implementation of the SOT-MRAM cells. Four example SOT-MRAM cells in the matrix (i.e., 100ik, 100im, 100jk, and 100jm) are shown explicitly in the figure, while the remaining SOT-MRAM cells in the matrix are not shown explicitly in the figure. The SOT-MRAM cells 100ik and 100im are in the i'th row of the matrix, while the SOT-MRAM cells 100jk and 100jm are in the j'th row of the matrix. The SOT-MRAM cells 100ik and 100jk are in the k'th column of the matrix, while the SOT-MRAM cells 100im and 100jm are in the m'th column of the matrix.

The integrated circuit 80 includes multiple write word lines and multiple read word lines. Two examples of the write word lines (i.e., WWL[i] and WWL[j]) and two examples of the read word lines (i.e., RWL[i] and RWL[j]) are shown explicitly in the figure. Each of the write word lines, extending in the direction parallel to the rows, is associated with one row of the SOT-MRAM cells, and thus the number of the write word lines matches the number of the rows. Each of the read word lines, extending in the direction parallel to the rows, is also associated with one row of the SOT-MRAM cells, and thus the number of the read word lines also matches the number of the rows.

The integrated circuit 80 includes multiple write bit lines, multiple read bit lines, and multiple source bit lines. Two examples of the write bit lines (i.e., WBL[k], WBL[m]), two examples of the read bit lines (i.e., RBL[k] and RBL[m]), and two examples of the source bit lines (i.e., SL[k] and SL[m]) are shown explicitly in the figure. Each of the write bit lines, the read bit lines, and the source bit lines extends in the direction parallel to the columns. Each of the write bit lines is associated with one column of the SOT-MRAM cells, and thus the number of the write bit lines matches the number of the columns. Each of the read bit lines is associated with one column of the SOT-MRAM cells, and thus the number of the read bit lines matches the number of the columns. Each of the source bit lines is associated with one column of the SOT-MRAM cells, and thus the number of the source bit lines matches the number of the columns.

Each of the SOT-MRAM cells, such as the SOT-MRAM cell 100 in FIG. 1B, is a memory device that uses magnetic states to store information, the SOT-MRAM cell 100 includes a magnetic tunneling junction structure ("MTJ structure") 150, a spin-orbit torque conductor ("SOT conductor") 160, a write switching transistor S1, and a read switching transistor S2. The MTJ structure 150 is coupled to the read bit line RBL through the channel of the read switching transistor S2, while the gate of the read switching transistor S2 is connected to a read word line RWL. The SOT conductor 160 has a first terminal 161 which is coupled to the write bit line WBL through the channel of the write switching transistor S1, while the gate of the write switching transistor S1 is connected to a write word line WWL. The SOT conductor 160 has a second terminal 162 which is directly connected to a source bit line SL.

The channel terminal of the write switching transistor S1 connected to the write bit line WBL forms a write port 110 of the SOT-MRAM cell 100. The channel terminal of the read switching transistor S2 connected to the read bit line RBL forms a read port 120 of the SOT-MRAM cell 100. The second terminal 162 of the SOT conductor 160 forms a source port 130 of the SOT-MRAM cell 100.

In the SOT-MRAM cell 100, the MTJ structure 150 has a free layer 152, a pinned layer 158, and a tunnel barrier layer 155. The tunnel barrier layer 155 is sandwiched between the free layer 152 and the pinned layer 158. Each of the free layer 152 and the pinned layer 158 is a conductive layer made of ferromagnetic materials, but the tunnel barrier layer 155 is a thin insulating layer made of high electrical resistance materials. The thickness of the tunnel barrier layer 155 is sufficiently thin to enable electrons quantum mechanically tunneling through the thin insulating layer between the two ferromagnetic layers. The probability of tunneling is influenced by the relative alignment of the magnetic moments of the two ferromagnetic layers.

While the magnetic moments of the pinned layer 158 are typically fixed in orientation, the magnetic moments of the free layer 152 are manipulated with an external magnetic field, with an applied current, or with other means. When the magnetic moments of the free layer 152 are parallel to the magnetic moments of the pinned layer 158, the tunneling probability is higher, resulting in lower electrical resistance. Conversely, when the magnetic moments of the free layer 152 are antiparallel to the magnetic moments of the pinned layer 158, the tunneling probability decreases, leading to higher electrical resistance. The two different values of the electrical resistance based on the relative orientation of the magnetic moments of the two ferromagnetic layers is exploited to represent the binary information Zero ("0") and the binary information One ("1") in the MRAM cell.

In the SOT-MRAM cell 100, the magnetic moments of the free layer 152 are manipulated with an electric current passing though the SOT conductor 160 which is deposited in proximity of the free layer 152. The free layer 152 is also in conductive contact with the SOT conductor 160. When an electric current flows through the SOT conductor 160, the spin-orbit torque effect induces a flow of electron spins within the SOT conductor 160. The spin-orbit torque generated by the spin current exerts a torque on the magnetic moments of the free layer 152 in the MTJ structure 150. The magnetic moments in the free layer 152 can be reoriented or flipped in magnetization direction by the spin-orbit torque, under a condition that the spin-orbit torque becomes sufficiently strong. A sufficiently large electric current passing though the SOT conductor 160 determines the orientation of the magnetic moments in the free layer 152. Because the resistance of the magnetic tunnel junction depends upon the orientation of the magnetic moments in the free layer 152, a write current applied to the SOT conductor 160 provides the mechanism to set the resistance of the magnetic tunnel junction, whereby the binary information is written into the MRAM cell.

In the SOT-MRAM cell 100, a write current is applied to the SOT conductor 160 through the channel of the write switching transistor S1 which is coupled to the first terminal 161 of the SOT conductor 160. The value of the resistance of the magnetic tunnel junction is detected based on the value of a current which serially passes through the channel of the read switching transistor S2 and the MTJ structure 150 while getting transported to the SOT conductor 160.

The SOT-MRAM cell 100 is operable in three operation modes: a writing mode, a reading mode, and a detached mode. To set the SOT-MRAM cell 100 to the writing mode, a write-on voltage on the write word line WWL is applied to the gate of the write switching transistor S1 to drive the write switching transistor S1 into the conducting state, and a read-off voltage on the read word line RWL is applied to the gate of the read switching transistor S2 to drive the read switching transistor S2 into the non-conducting state. To set the SOT-MRAM cell 100 to the reading mode, a read-on voltage on the read word line RWL is applied to the gate of the read switching transistor S2 to drive the read switching transistor S2 into the conducting state, and a write-off voltage on the write word line WWL is applied to the gate of the write switching transistor S1 to drive the write switching transistor S1 into the non-conducting state. To set the SOT-MRAM cell 100 to the detached mode, a write-off voltage on the write word line WWL is applied to the gate of the write switching transistor S1 to drive the write switching transistor S1 into the non-conducting state, and a read-off voltage on the read word line RWL is applied to the gate of the read switching transistor S2 to drive the read switching transistor S2 into the non-conducting state.

A write operation on the SOT-MRAM cell 100 includes setting the SOT-MRAM cell 100 to the writing mode. During the write operation, in response to the write switching transistor S1 being driven into the conducting state, the first terminal 161 of the SOT conductor 160 is conductivity connected to the write bit line WBL through the channel of the write switching transistor S1, and the voltage difference between the voltage on the write bit line WBL and the voltage on the source bit line SL determines the current direction flowing in the SOT conductor 160. In some implementations, to write a first binary value (such as the value "1") into the SOT-MRAM cell 100, a positive voltage VW is applied to the write bit line WBL and a ground voltage VGND is applied to the source bit line SL, which induces a positive current flowing from the first terminal 161 to the second terminal 162 of the SOT conductor 160. To write a second binary value (such as the value "0") into the SOT-MRAM cell 100, a ground voltage VGND is applied to the write bit line WBL and a positive voltage VW is applied to the source bit line SL, which induces a negative current flowing from the first terminal 161 to the second terminal 162 of the SOT conductor 160 (i.e., equivalently, a positive current flowing from the second terminal 162 to the first terminal 161). The positive current flowing from the first terminal 161 to the second terminal 162 and the negative current flowing from the first terminal 161 to the second terminal 162 are opposite in flow direction.

A read operation on the SOT-MRAM cell 100 includes setting the SOT-MRAM cell 100 to the reading mode. During the read operation, in response to the read switching transistor S2 being driven into the conducting state, the MTJ structure 150 is conductivity connected to the read bit line RBL through the channel of the read switching transistor S2, and the read current flowing from the read bit line RBL to the source bit line SL through the MTJ structure 150 and the SOT conductor 160 is detected, whereby the resistance of the MTJ structure 150 is measured and the binary value stored in the SOT-MRAM cell 100 is read out.

The SOT-MRAM cell 100 is set to the detached mode to prevent the MTJ structure 150 in the SOT-MRAM cell 100 from being influenced by the electric signals on various bit lines and to prevent the MTJ structure 150 in the SOT-MRAM cell 100 from inadvertently influencing the electric signals on various bit lines. The electric signals on various bit lines include the voltage and/or current carried by the write bit line WBL, the read bit line RBL, or the source bit line SL.

In the integrated circuit 80 with a matrix of SOT-MRAM cells, as shown in FIG. 1A, each row of SOT-MRAM cells is associated with a corresponding write word line and a corresponding read word line. The gate of the write switching transistor S1 in each of the SOT-MRAM cells in the row is connected to the corresponding write word line WWL, and the gate of the read switching transistor S2 in each of the SOT-MRAM cells in the row is connected to the corresponding read word line RWL.

For example, the gate of the write switching transistor S1 in each of the SOT-MRAM cells in the i'th row is connected to the write word line WWL[i], and the gate of the read switching transistor S2 in each of the SOT-MRAM cells in the i'th row is connected to the read word line RWL[i]. Similarly, the gate of the write switching transistor S1 in each of the SOT-MRAM cells in the j'th row is connected to the write word line WWL[j], and the gate of the read switching transistor S2 in each of the SOT-MRAM cells in the j'th row is connected to the read word line RWL[j].

In the integrated circuit 80 with a matrix of SOT-MRAM cells, as shown in FIG. 1A, each column of SOT-MRAM cells is associated with a corresponding write bit line, a corresponding read bit line, and a source bit line. The first terminal of the SOT conductor in each of the SOT-MRAM cells in the column is coupled to the corresponding write bit line through the channel of the write switching transistor S1. The second terminal of the SOT conductor in each of the SOT-MRAM cells in the column is directly connected to the corresponding source bit line SL. The MTJ structure in each of the SOT-MRAM cells in the column is coupled to the corresponding read bit line through the channel of the read switching transistor S2.

For example, the first terminal of the SOT conductor in each of the SOT-MRAM cells in the k'th column is coupled to the write bit line WBL[k] through the channel of the write switching transistor S1, the second terminal of the SOT conductor in each of the SOT-MRAM cells in the k'th column is directly connected to the source bit line SL[k], and the MTJ structure in each of the SOT-MRAM cells in the k'th column is coupled to the read bit line RBL[k] through the channel of the read switching transistor S2. Similarly, the first terminal of the SOT conductor in each of the SOT-MRAM cells in the m'th column is coupled to the write bit line WBL[m] through the channel of the write switching transistor S1, the second terminal of the SOT conductor in each of the SOT-MRAM cells in the m'th column is directly connected to the source bit line SL[m], and the MTJ structure in each of the SOT-MRAM cells in the m'th column is coupled to the read bit line RBL[m] through the channel of the read switching transistor S2.

The write operation on the matrix of SOT-MRAM cells in FIG. 1A is performed row by row by selecting one row of SOT-MRAM cells for writing at a time. Assuming the integer N is the number of rows in the matrix, for a positive integer n≤N, the n'th row of SOT-MRAM cells is selected for writing by setting the SOT-MRAM cells in the n'th row to the writing mode, whereby the n'th row becomes the selected row subjected to the write operation. In some embodiments, in addition to setting the SOT-MRAM cells in the n'th row to the writing mode, the SOT-MRAM cells in all the remaining N−1 rows are set to the detached mode. In some alternative embodiments, in addition to setting the SOT-MRAM cells in the n'th row to the writing mode, the SOT-MRAM cells in another row is set to the reading mode, and the SOT-MRAM cells in all the remaining N−2 rows are set to the detached mode. In the example as shown in FIG. 1A, as the SOT-MRAM cells in the i'th row (i.e., n=i) is set to the writing mode and the SOT-MRAM cells in the j'th row is set to the reading mode, the SOT-MRAM cells in all the remaining N−2 rows are set to the detached mode.

In FIG. 1A, the selection of the selected row for the write operation and the selection of the selected row for the read operation are controlled with the WL driver and the control circuits 82 and 84.

During the write operation performed on a selected row of SOT-MRAM cells, the write operation on each individual SOT-MRAM cell in the selected row is carried out by applying the required voltages on the write bit line WBL and/or the source bit line SL that are coupled to the individual SOT-MRAM cell. The required voltages on the write bit line WBL and/or the source bit line SL depend on the binary value to be written into the individual SOT-MRAM cell. In one example as shown in FIG. 1A, the selected row for the write operation is the i'th row, and examples of the SOT-MRAM cells in the selected row for the write operation include the SOT-MRAM cell 100ik in the k'th column and the SOT-MRAM cell 100im in the m'th column. To write the binary value "0" into the SOT-MRAM cell 100ik, a ground voltage VGND is applied to the write bit line WBL[k] coupled to the SOT-MRAM cell 100ik, and a positive voltage VW is applied to the source bit line SL[k] coupled to the SOT-MRAM cell 100ik, whereby a current is induced flowing from the source bit line SL[k] to the write bit line WBL[k]. To write the binary value "1" into the SOT-MRAM cell 100im, a positive voltage VW is applied to the write bit line WBL[m] coupled to the SOT-MRAM cell 100im, and a ground voltage VGND is applied to the source bit line SL[m] coupled to the SOT-MRAM cell 100im, whereby a current is induced flowing from the write bit line WBL[m] to the source bit line SL[m].

In FIG. 1A, the required voltages applied various write bit lines and various source bit line SL are provided by a writing circuit 85. The current generated from the writing circuit 85 includes the current flowing from the source bit line SL[k] to the write bit line WBL[k], and the current flowing from the write bit line WBL[m] to the source bit line SL[m].

The read operation on the matrix of SOT-MRAM cells in FIG. 1A is performed row by row by selecting one row of SOT-MRAM cells for reading at a time. Assuming the integer N is the number of rows in the matrix, for a positive integer n≤N, the n'th row of SOT-MRAM cells is selected for reading by setting the SOT-MRAM cells in the n'th row to the reading mode, whereby the n'th row becomes the selected row subjected to the read operation. In some embodiments, in addition to setting the SOT-MRAM cells in the n'th row to the reading mode, the SOT-MRAM cells in all the remaining N–1 rows are set to the detached mode. In some alternative embodiments, in addition to setting the SOT-MRAM cells in the n'th row to the reading mode, the SOT-MRAM cells in another row is set to the writing mode, the SOT-MRAM cells in all the remaining N–2 rows are set to the detached mode. In the example as shown in FIG. 1A, as the SOT-MRAM cells in the j'th row (i.e., n=j) is set to the reading mode and the SOT-MRAM cells in the i'th row is set to the writing mode, the SOT-MRAM cells in all the remaining N–2 rows are set to the detached mode.

During the read operation performed on a selected row of SOT-MRAM cells, the read operation on each individual SOT-MRAM cell in the selected row is carried out by detecting the voltage changes on the read bit line RBL that are coupled to the individual SOT-MRAM cell, and detecting the voltage changes is carried out with a sense amplifier SA coupled to the read bit line RBL. In one example as shown in as shown in FIG. 1A, the selected row for the read operation is the j'th row, and examples of the SOT-MRAM cells in the selected row for the read operation include the SOT-MRAM cell 100jk in the k'th column and the SOT-MRAM cell 100jm in the m'th column. The read operation on the SOT-MRAM cell 100jk is carried out by detecting the voltage changes on the read bit line RBL[k] with a sense amplifier SA[k], as shown schematically in FIG. 2A. The read operation on the SOT-MRAM cell 100jm is carried out by detecting the voltage changes on the read bit line RBL[m] with a sense amplifier SA[m], as shown schematically in FIG. 2B.

Figure 2A:
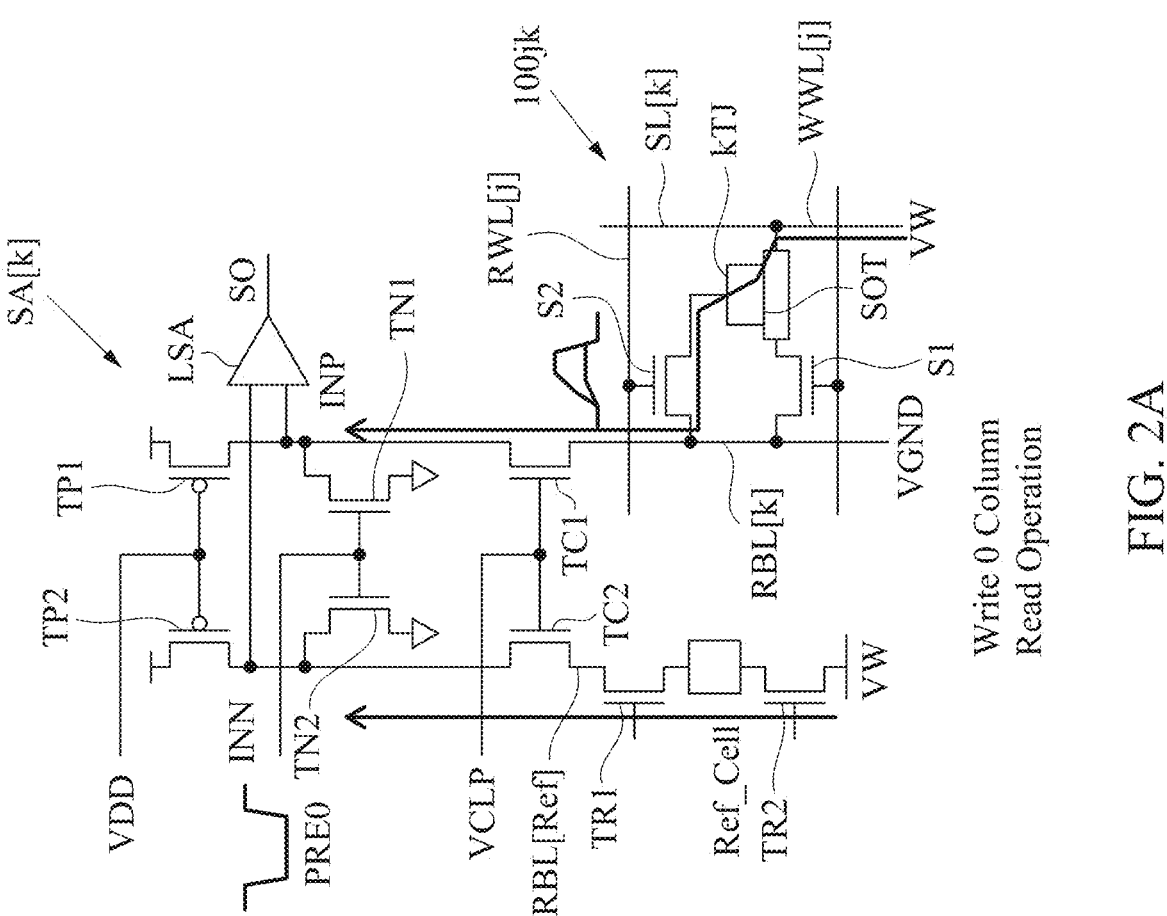
FIGS. 2A-2B are circuit diagrams of sense amplifiers coupled to SOT-MRAM cells and reference cells, in accordance with some embodiments.
Figure 2B:
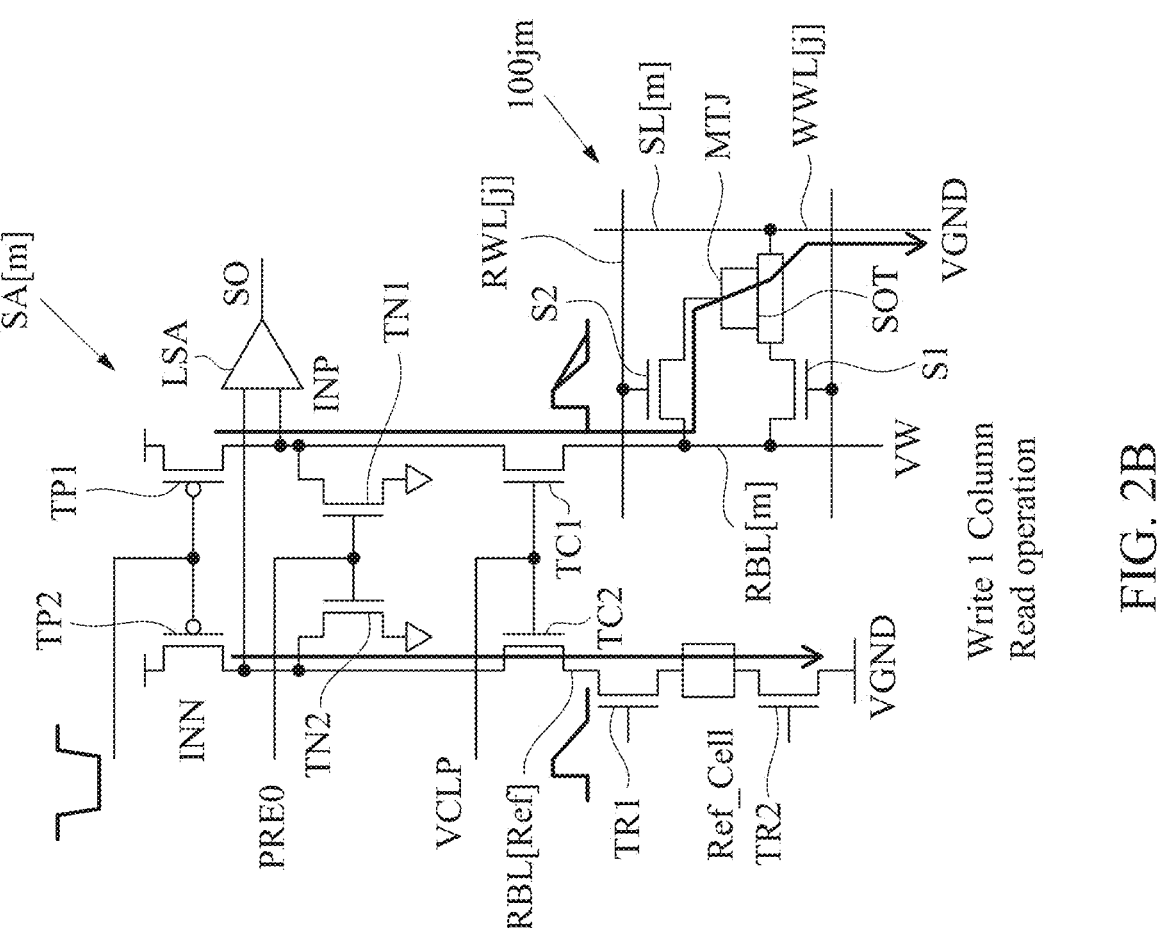

FIGS. 2A-2B are circuit diagrams of sense amplifiers coupled to SOT-MRAM cells and reference cells, in accordance with some embodiments. Each of the sense amplifier (e.g., SA[k] in FIG. 2A, or SA[m] in FIG. 2B) includes PMOS transistors TP1 and TP2, NMOS transistors TN1 and TN2, and a differential amplifier LSA. The gates of the PMOS transistors TP1 and TP2 are connected together and configured to receive a pre-charge enabling signal PRE. The gates of the NMOS transistors TN1 and TN2 are connected together and configured to receive a pre-charge enabling signal PRE0. The channels of the PMOS transistor TP1 and the NMOS transistor TN1 are connected together at a connection node INP which is further connected to a first input of differential amplifier LSA. The channel of the PMOS transistor TP2 is connected to the channel of the NMOS transistor TN2 at a connection node INN which is further connected to a second input of differential amplifier LSA.

The connection node INP is coupled to a read bit line (e.g., RBL[k] in FIG. 2A, or RBL[m] in FIG. 2B) through the channel of a coupling transistor TC1. The connection node INN is coupled to a reference bit line RBL[Ref] through the channel of a coupling transistor TC2. The channel of coupling transistor TR1, the reference cell Ref-_Cell, and the channel of coupling transistor TR2 are serially connected between the channel of coupling transistors TC2 and a constant voltage node (which is held at the voltage VW in FIG. 2A and at the voltage VGND in FIG. 2B). In some embodiments, the reference cell Ref_Cell is a SOT-MRAM cell implemented with the same cell structure as the SOT-MRAM cell 100 in FIG. 1A.

In FIG. 2A, during the read operation on the SOT-MRAM cell 100jk, each of the coupling transistor TC1 and the read switching transistor S2 is in the conducting state, and the bit line capacitance (not shown in the figure) associated with the read bit line RBL[k] is charged with the current that passes through the MTJ structure in the SOT-MRAM cell 100jk, which causes a voltage change at the connection node INP coupled to the first input of differential amplifier LSA. In addition, during the read operation, each of the coupling transistors TC2, TR1, and TR2 is also in the conducting state, and the bit line capacitance (not shown in the figure) associated with reference bit line RBL[Ref] is charged with the current that passes through the MTJ structure in the reference cell Ref_Cell., which causes a voltage change at the connection node INN coupled to the second input of differential amplifier LSA.

The voltage changes at the first input of differential amplifier LSA is related to the value of the electrical resistance of the MTJ structure in the SOT-MRAM cell 100jk: the smaller the value of the electrical resistance, the faster the voltage change at the first input of differential amplifier LSA. The voltage change at the first input of differential amplifier LSA is compared with the voltage change at the second input of differential amplifier LSA, where the voltage change at the second input is related to the value of the electrical resistance of the MTJ structure in the reference cell Ref_Cell. That is, the output voltage at the output SO of differential amplifier LSA is related to a difference between the electrical resistance of the MTJ structure in the SOT-MRAM cell 100jk and the electrical resistance of the MTJ structure in the reference cell Ref-_Cell. Based on the output voltage at the output SO of differential amplifier LSA, the binary value stored in the SOT-MRAM cell 100jk is read out.

In FIG. 2B, the read operation on the SOT-MRAM cell 100jm includes two steps. In a first step, the bit line capacitance (not shown in the figure) associated with the read bit line RBL[m] is pre-charged to a pre-determined value. In a second step, the discharge of the voltage on the bit line capacitance (not shown in the figure) associated with the read bit line RBL[m] is detected with the sense amplifier SA[m].

In one example, during the first step of the read operation on the SOT-MRAM cell 100jm, each of the NMOS transistors TN1 and TN2 is driven into the non-conducting state with a pre-charge enabling signal PRE0, and then, each of the PMOS transistors TP1 and TP2 is driven into the conducting state with a pre-charge enabling signal PRE, and the bit line capacitance associated with the read bit line RBL[m] is pre-charged to a voltage that is equal to the first supply voltage VDD.

During the second step of the read operation on the SOT-MRAM cell 100jm, as shown in FIG. 2B, each of the coupling transistor TC1 and the read switching transistor S2 is in the conducting state, and the bit line capacitance (not shown in the figure) associated with the read bit line RBL[m] is discharged with the current that passes through the MTJ structure in the SOT-MRAM cell 100*jm*, which causes a voltage change at the connection node INP coupled to the first input of differential amplifier LSA. In addition, during the second step of the read operation, each of the coupling transistors TC2, TR1, and TR2 is also in the conducting state, and the bit line capacitance (not shown in the figure) associated with reference bit line RBL[Ref] is charged with the current that passes through the MTJ structure in the reference cell Ref_Cell., which causes a voltage change at the connection node INN coupled to the second input of differential amplifier LSA.

During the second step of the read operation on the SOT-MRAM cell 100*jm*, the voltage changes at the first input of differential amplifier LSA is related to the value of the electrical resistance of the MTJ structure in the SOT-MRAM cell 100*jm*: the smaller the value of the electrical resistance, the faster the voltage change at the first input of differential amplifier LSA. The voltage change at the first input of differential amplifier LSA is compared with the voltage change at the second input of differential amplifier LSA, where the voltage change at the second input is related to the value of the electrical resistance of the MTJ structure in the reference cell Ref_Cell. That is, the output voltage at the output SO of differential amplifier LSA is related to a difference between the electrical resistance of the MTJ structure in the SOT-MRAM cell 100*jm* and the electrical resistance of the MTJ structure in the reference cell Ref_Cell. Based on the output voltage at the output SO of differential amplifier LSA, the binary value stored in the SOT-MRAM cell 100*jm* is read out.

Figure 3:
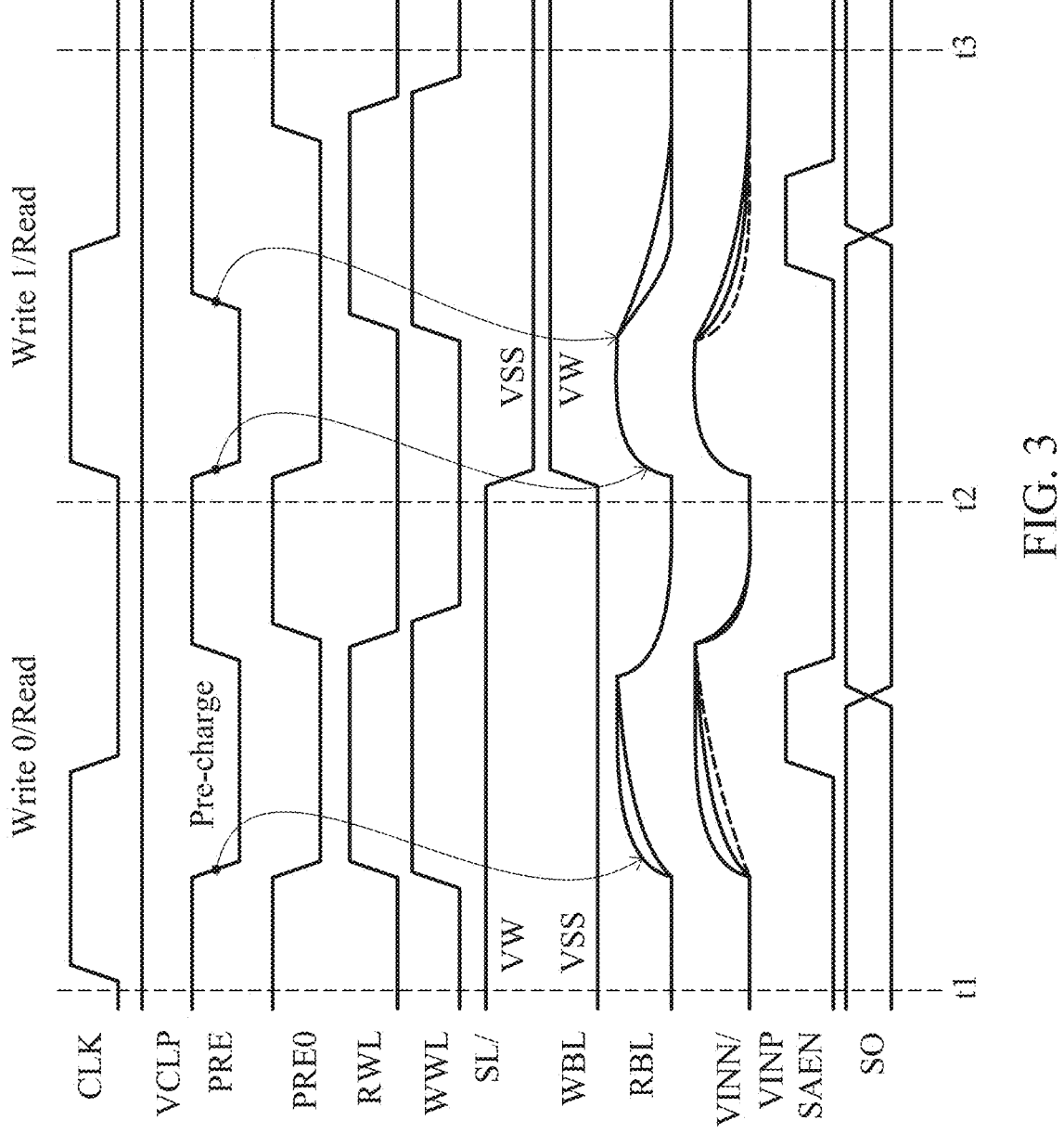
FIG. 3 is a timing diagram of various signals in the integrated circuit with SOT-MRAM cells, in accordance with some embodiments.

FIG. 3 is a timing diagram of various signals in the integrated circuit with SOT-MRAM cells, in accordance with some embodiments. The signals depicted in FIG. 3 includes the master clock signal CLK configured to synchronize various components of the integrated circuit, the coupling control signal VCLP configured to control the conducting states of the coupling transistors TC1 and TC2 (as shown in FIGS. 2A-2B), the pre-charging control signal PRE configured to control the conducting states of PMOS transistors TP1 and TP2 (as shown in FIGS. 2A-2B), and the pre-charging control signal PRE0 configured to control the conducting states of NMOS transistors TN1 and TN2 (as shown in FIGS. 2A-2B). The signals depicted in FIG. 3 include the read-on/read-off voltages on the read word line RWL, and the write-on/write-off voltages on the write word line WWL, the voltages applied to the source bit line SL and the write bit line WBL. The lower supply voltage VSS is implemented as the voltage VGND for driving the source bit line SL or the write bit line WBL in FIGS. 2A-2B. The signals depicted in FIG. 3 include the voltages on the read bit line RBL for two different values of the electrical resistance of the MTJ structure, the voltages at the connection node INP corresponding to two different values of the electrical resistance of the MTJ structure, and the voltages at the connection node INN associated with the read bit line RBL[Ref] in FIGS. 2A-2B. The bottom two signals SAEN and SO in FIG. 3 are correspondingly the sense amplifier enabling signal and the voltage at the output SO of the differential amplifier LSA.

In FIG. 3, between time t1 and t2, the read operation on the SOT-MRAM cell 100*jk* (as shown in FIG. 2A) is performed, the voltage at the output SO of the differential amplifier LSA is detected to determine the voltage change-rate at the rising edge of the voltage at the connection node INP (which is the voltage change-rate at the read bit line RBL[k]) due to the charging of the voltage on the bit line capacitance by the current that passes through the MTJ structure in the SOT-MRAM cell 100*jk*. Different voltage change-rate at the read bit line RBL[k] is associated with a different binary value stored in the SOT-MRAM cell 100*jk*. Consequently, the binary value stored in the SOT-MRAM cell 100*jk* is read out based on the measurement of the voltage at the output SO of the differential amplifier LSA.

In FIG. 3, between time t2 and t3, the read operation on the SOT-MRAM cell 100*jm* (as shown in FIG. 2B) is performed, the voltage at the output SO of the differential amplifier LSA is detected to determine the voltage change-rate at the falling edge of the voltage at the connection node INP (which is the voltage change-rate at the read bit line RBL[m]) due to the discharging of the voltage on the bit line capacitance by the current that passes through the MTJ structure in the SOT-MRAM cell 100*jm*. Different discharging rate of the voltage at the read bit line RBL[m] is associated with a different binary value stored in the SOT-MRAM cell 100*jm*. Consequently, the binary value stored in the SOT-MRAM cell 100*jm* is read out based on the measurement of the voltage at the output SO of the differential amplifier LSA.

In FIG. 1A, the SOT-MRAM cell 100*jk* (as shown in FIG. 2A) and the SOT-MRAM cell 100*jm* (as shown in FIG. 2B) in the j'th row are two example SOT-MRAM cells in the selected row for the read operation. The SOT-MRAM cell 100*jk* is associated with a corresponding SOT-MRAM cell 100*ik* in the same k'th column, and the SOT-MRAM cell 100*jm* is associated with a corresponding SOT-MRAM cell 100*im* in the same m'th column. Both the SOT-MRAM cell 100*ik* and the SOT-MRAM cell 100*im* are in the i'th row which is the selected row for the write operation.

In FIG. 1A, the SOT-MRAM cell 100*jk* in the j'th row is associated with a corresponding SOT-MRAM cell 100*ik* (in the same k'th column and in the i'th row) which is configured to receive the binary value "0" while the i'th row is selected for writing. As the binary value "0" is written into the SOT-MRAM cell 100*ik*, the read operation on the SOT-MRAM cell 100*jk* is performed between time t1 and t2, and the voltage change at the read bit line RBL[k] due to the charging of the voltage on the bit line capacitance is detected. In addition to the SOT-MRAM cell 100*jk*, the read operation on some other SOT-MRAM cells in the j'th row are also performed between time t1 and t2 to detect voltage changes due to the charging of the voltage on a corresponding bit line capacitance. Each of the SOT-MRAM cells in the j'th row subject to the read operation between time t1 and t2 is associated with a corresponding SOT-MRAM cell in the i'th row (in the same column) which is configured to receive the binary value "0" while the i'th row is selected for writing.

In FIG. 1A, the SOT-MRAM cell 100*jm* in the j'th row is associated with a corresponding SOT-MRAM cell 100*im* (in the same m'th column and in the i'th row) which is configured to receive the binary value "1" while the i'th row is selected for writing. As the binary value "1" is written into the SOT-MRAM cell 100*im*, the read operation on the SOT-MRAM cell 100*jm* is performed between time t2 and t3, and the voltage change at the read bit line RBL[m] due to the discharging of the voltage on the bit line capacitance is detected. In addition to the SOT-MRAM cell 100*jm*, the read operation on some other SOT-MRAM cells in the j'th row are also performed between time t2 and t3 to detect voltage changes due to the discharging of the voltage on a corresponding bit line capacitance. Each of the SOT-MRAM cells in the j'th row subject to the read operation between time t2 and t3 is associated with a corresponding SOT-MRAM cell in the i'th row (in the same column) which is configured to receive the binary value "1" while the i'th row is selected for writing.

FIG. 4 is a flowchart of a method 400 of fabricating a memory device, in accordance with some embodiments. The sequence in which the operations of the method 400 are depicted in FIG. 4 is for illustration only; the operations of the method 400 are capable of being executed in sequences that differ from that depicted in FIG. 4. It is understood that additional operations may be performed before, during, and/or after the method 400 depicted in FIG. 4, and that some other processes may only be briefly described herein. The method 400 includes operations 410, 420, 430, 440, 445, and 450.

In operation 410 of the method 400, each SOT-MRAM cell in a first row is driven into a writing mode and each SOT-MRAM cell in a second row is driven into a reading mode. In the example embodiments as shown in FIG. 1A, at least the SOT-MRAM cell 100*ik* and the SOT-MRAM cell 100*im* in the i'th row are driven into the writing mode, and at least the SOT-MRAM cell 100*jk* and the SOT-MRAM cell 100*jm* in the j'th row are driven into the reading mode.

In operation 420 of the method 400, a first current is generated and the first current passes through the SOT conductor in a first SOT-MRAM cell in the first row. In the example embodiments as shown in FIG. 1A, a current passing through the SOT conductor in the SOT-MRAM cell 100*ik* in the i'th row is generated, and the current generated flows from the source bit line SL[k] to the write bit line WBL[k].

In operation 430 of the method 400, a voltage change on a first read bit line is detected by a first sense amplifier while the first read bit line is charging with a first read current passing through the MTJ structure in a second SOT-MRAM cell in the second row. In the example embodiments as shown in FIG. 1A and FIG. 2A, the read bit line RBL[k] is charged with the current that passes through the MTJ structure in the SOT-MRAM cell 100*jk* in the k'th row, which causes a voltage change at the connection node INP coupled to the first input of differential amplifier LSA. As the voltage change at the connection node INP causes a change of the output voltage at the output SO of differential amplifier LSA, the voltage change on the read bit line RBL[k] is detected.

In operation 440 of the method 400, a second current is generated and the second current passes through the SOT conductor in a third SOT-MRAM cell in the first row. In the example embodiments as shown in FIG. 1A, a current passing through the SOT conductor in the SOT-MRAM cell 100*im* in the i'th row is generated, and the current generated flows from the write bit line WBL[m] to the source bit line SL[m].

In operation 445 of the method 400, a second read bit line connected to a fourth SOT-MRAM cell in the second row is charged to a predetermined reference voltage. In the example embodiments as shown in FIG. 1A and FIG. 2B, the read bit line RBL[m] connected to the SOT-MRAM cell 100*jm* in the j'th row is pre-charged to a predetermined reference voltage that is equal to the first supply voltage VDD, in response to the PMOS transistors TP1 and TP2 being driven into the conducting state and the NMOS transistors TN1 and TN2 being maintained at the non-conducting state.

In operation 450 of the method 400, a voltage change on the second read bit line is detected by a second sense amplifier while the second read bit line is discharging with a second read current passing through the MTJ structure in the fourth SOT-MRAM cell. In the example embodiments as shown in FIG. 1A and FIG. 2B, the read bit line RBL[m] begins with a predetermined reference voltage that is equal to the first supply voltage VDD, the read bit line RBL[m] is then discharged with the current that passes through the MTJ structure in the SOT-MRAM cell 100*jm* in the m'th row, which causes a voltage change at the connection node INP coupled to the first input of differential amplifier LSA. As the voltage change at the connection node INP causes a change of the output voltage at the output SO of differential amplifier LSA, the voltage change on the read bit line RBL[m] is detected.

An aspect of the present disclosure relates to a memory device. The memory device includes a matrix of SOT-MRAM cells each having a magnetic tunneling junction ("MTJ") structure and a spin-orbit torque ("SOT") conductor. Each SOT-MRAM cell in a first row is set to a writing mode and each SOT-MRAM cell in a second row is set to a reading mode. The memory device also includes a first write bit line, a first source bit line, and a first read bit line coupled to a first SOT-MRAM cell and a second SOT-MRAM cell in a first column, and a first sense amplifier configured to detect a voltage change on the first read bit line while the first read bit line is charged with a first read current passing through the MTJ structure in a second SOT-MRAM cell which is in the second row. The memory device further includes a second write bit line, a second source bit line, and a second read bit line coupled to a third SOT-MRAM cell and a fourth SOT-MRAM in a second column, and a second sense amplifier configured to detect a voltage change on the second read bit line while the second read bit line is discharged with a second read current passing through the MTJ structure in a fourth SOT-MRAM cell which is in the second row. The first write bit line and the first source bit line are configured to have a first current passing through the SOT conductor in the first SOT-MRAM cell which is in the first row. The second write bit line and the second source bit line are configured to have a second current passing through the SOT conductor in the third SOT-MRAM cell which is in the first row. The first current and the second current are opposite in flow direction.

Another aspect of the present disclosure relates to a device. The device includes a matrix of SOT-MRAM cells, in which each SOT-MRAM cell has a write port, a read port, and a source port. The device also includes a first write bit line and a first read bit line associated with a first column of SOT-MRAM cells, and a second write bit line and a second read bit line associated with a second column of SOT-MRAM cells. The write port of each SOT-MRAM cell in the first column is connected to the first write bit line and the read port of each SOT-MRAM cell in the first column is connected to the first read bit line. The write port of each SOT-MRAM cell in the second column is connected to the second write bit line and the read port of each SOT-MRAM cell in the second column is connected to the second read bit line. The device further includes a writing circuit, a first sense amplifier, and a second sense amplifier. The writing circuit is configured to output a first current into the first write bit line and configured to output a second current into the second write bit line. The first current and the second current are opposite in flow direction. The first sense amplifier is configured to detect a voltage change on the first read bit line while the first read bit line is charged by the first sense amplifier. The second sense amplifier is configured to detect a voltage change on the second read bit line while the second read bit line is discharging after the second read bit line is pre-charged by the second sense amplifier.

Still another aspect of the present disclosure relates to a method of operating on a matrix of SOT-MRAM cells each having a magnetic tunneling junction ("MTJ") structure and a spin-orbit torque ("SOT") conductor. The method includes driving each SOT-MRAM cell in a first row into a writing mode, and driving each SOT-MRAM cell in a second row into a reading mode. The method also includes generating a first current passing through the SOT conductor in a first SOT-MRAM cell in the first row, and detecting a voltage change on a first read bit line by a first sense amplifier while the first read bit line is charging with a first read current passing through the MTJ structure in a second SOT-MRAM cell in the second row. The first SOT-MRAM cell and the second SOT-MRAM cell are in a first column. The method further includes generating a second current passing through the SOT conductor in a third SOT-MRAM cell in the first row, detecting a voltage change on a second read bit line by a second sense amplifier while the second read bit line is discharging with a second read current passing through the MTJ structure in a fourth SOT-MRAM cell in the second row after the second read bit line is pre-charged by the second sense amplifier. The third SOT-MRAM cell and the fourth SOT-MRAM cell are in a second column. The first current and the second current are opposite in flow direction.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A memory device, comprising:
a matrix of SOT-MRAM cells each having a magnetic tunneling junction ("MTJ") structure and a spin-orbit torque ("SOT") conductor, wherein each SOT-MRAM cell in a first row is set to a writing mode and each SOT-MRAM cell in a second row is set to a reading mode;
a first write bit line, a first source bit line, and a first read bit line coupled to a first SOT-MRAM cell and a second SOT-MRAM in a first column, the first write bit line and the first source bit line being configured to have a first current passing through the SOT conductor in the first SOT-MRAM cell which is in the first row;
a first sense amplifier configured to detect a voltage change on the first read bit line while the first read bit line is charged with a first read current passing through the MTJ structure in a second SOT-MRAM cell which is in the second row;
a second write bit line, a second source bit line, and a second read bit line coupled to a third SOT-MRAM cell and a fourth SOT-MRAM in a second column, the second write bit line and the second source bit line being configured to have a second current passing through the SOT conductor in the third SOT-MRAM cell which is in the first row, wherein the first current and the second current are opposite in flow direction; and
a second sense amplifier configured to detect a voltage change on the second read bit line while the second read bit line is discharged with a second read current passing through the MTJ structure in a fourth SOT-MRAM cell which is in the second row.

2. The memory device of claim 1, wherein the MTJ structure comprises:
a free layer, a pinned layer, and a tunnel barrier layer sandwiched between the free layer and the pinned layer, wherein the free layer is in conductive contact with a SOT conductor.

3. The memory device of claim 2, wherein each of the first SOT-MRAM cell and the third SOT-MRAM cell comprises:
a write switching transistor having a channel thereof connecting a first terminal of the SOT conductor with one of the first write bit line or the second write bit line, wherein the SOT conductor has a second terminal thereof connected to one of the first source bit line or the second source bit line.

4. The memory device of claim 2, wherein each of the second SOT-MRAM cell and the fourth SOT-MRAM cell comprises:
a read switching transistor having a channel thereof connecting the pinned layer of the MTJ structure with one of the first read bit line or the second read bit line.

5. The memory device of claim 2, wherein each of the first sense amplifier and the second sense amplifier comprises:
a differential amplifier;
a first PMOS transistor and a first NMOS transistor having channels thereof connected together at a first connection node which is further connected to a first input of the differential amplifier; and
a second PMOS transistor and a second NMOS transistor having channels thereof connected together at a second connection node which is further connected to a second input of the differential amplifier.

6. The memory device of claim 5, wherein each of the first sense amplifier and the second sense amplifier further comprising:
a first coupling transistor having a channel thereof connected between the first input of the differential amplifier and one of the first read bit line or the second read bit line; and
a second coupling transistor having a channel thereof connected between the second input of the differential amplifier and a reference bit line which is connected to a reference cell.

7. A device, comprising:
a matrix of SOT-MRAM cells, each SOT-MRAM cell having a write port, a read port, and a source port;
a first write bit line and a first read bit line associated with a first column of SOT-MRAM cells, wherein the write port of each SOT-MRAM cell in the first column is connected to the first write bit line and the read port of each SOT-MRAM cell in the first column is connected to the first read bit line;
a second write bit line and a second read bit line associated with a second column of SOT-MRAM cells, wherein the write port of each SOT-MRAM cell in the second column is connected to the second write bit line and the read port of each SOT-MRAM cell in the second column is connected to the second read bit line;
a writing circuit configured to output a first current into the first write bit line and configured to output a second current into the second write bit line, wherein the first current and the second current are opposite in flow direction;
a first sense amplifier configured to detect a voltage change on the first read bit line while the first read bit line is charged by the first sense amplifier; and a second sense amplifier configured to detect a voltage change on the second read bit line while the second read bit line is discharging after the second read bit line is pre-charged by the second sense amplifier.

8. The device of claim 7, wherein each of the first sense amplifier and the second sense amplifier comprises:

a differential amplifier;

a first PMOS transistor and a first NMOS transistor having channels thereof connected together at a first connection node which is further connected to a first input of the differential amplifier; and a second PMOS transistor and a second NMOS transistor having channels thereof connected together at a second connection node which is further connected to a second input of the differential amplifier.

9. The device of claim 8, wherein each of the first sense amplifier and the second sense amplifier further comprising:

a first coupling transistor having a channel thereof connected between the first input of the differential amplifier and one of the first read bit line or the second read bit line; and a second coupling transistor having a channel thereof connected between the second input of the differential amplifier and a reference bit line which is connected to a reference cell.

10. The device of claim 7, further comprising:

a first source bit line connected to the source port of each SOT-MRAM cell in the first column; and a second source bit line connected to the source port of each SOT-MRAM cell in the second column.

11. The device of claim 10, wherein the writing circuit configured to apply a first voltage to the first write bit line and apply a second voltage to the first source bit line and to apply the first voltage to the first source bit line and the second voltage to the second write bit line.

12. The device of claim 7, wherein each SOT-MRAM cell comprises:

a spin-orbit torque ("SOT") conductor; and a magnetic tunneling junction ("MTJ") structure having a free layer, a pinned layer, and a tunnel barrier layer sandwiched between the free layer and the pinned layer, and wherein the free layer is in conductive contact with the SOT conductor.

13. The device of claim 12, further comprising:

a write switching transistor having a channel thereof connected between the write port and a first terminal of the SOT conductor, wherein the SOT conductor has a second terminal thereof connected to the source port; and a read switching transistor having a channel thereof connected between the read port and the pinned layer of the MTJ structure.

14. The device of claim 13, wherein the first column of SOT-MRAM cells includes a first SOT-MRAM cell and a second SOT-MRAM cell, wherein the second column of SOT-MRAM cells includes a third SOT-MRAM cell and a fourth SOT-MRAM cell, further comprising:

a first write word line connected to a gate of the write switching transistor in the first SOT-MRAM cell and connected to a gate of the write switching transistor in the third SOT-MRAM cell;

a first read word line connected to a gate of the read switching transistor in the first SOT-MRAM cell and connected to a gate of the read switching transistor in the second SOT-MRAM cell;

a second write word line connected to a gate of the write switching transistor in the third SOT-MRAM cell and connected to a gate of the write switching transistor in the fourth SOT-MRAM cell; and a second read word line connected to a gate of the read switching transistor in the third SOT-MRAM cell and connected to a gate of the read switching transistor in the fourth SOT-MRAM cell.

15. A method of operating on a matrix of SOT-MRAM cells each having a magnetic tunneling junction ("MTJ") structure and a spin-orbit torque ("SOT") conductor, the method comprising:

applying voltages to drive each SOT-MRAM cell in a first row into a writing mode;

applying voltages to drive each SOT-MRAM cell in a second row into a reading mode;

generating a first current passing through the SOT conductor in a first SOT-MRAM cell in the first row;

detecting a voltage change on a first read bit line by a first sense amplifier while the first read bit line is charging with a first read current passing through the MTJ structure in a second SOT-MRAM cell in the second row, wherein the first SOT-MRAM cell and the second SOT-MRAM cell are in a first column;

generating a second current passing through the SOT conductor in a third SOT-MRAM cell in the first row, wherein the first current and the second current are opposite in flow direction; and detecting a voltage change on a second read bit line by a second sense amplifier while the second read bit line is discharging with a second read current passing through the MTJ structure in a fourth SOT-MRAM cell in the second row after the second read bit line is pre-charged by the second sense amplifier, wherein the third SOT-MRAM cell and the fourth SOT-MRAM cell are in a second column.

16. The method of claim 15, further comprising:

detecting the voltage change on the first read bit line while generating the first current; and detecting the voltage change on the second read bit line while generating the second current.

17. The method of claim 16, further comprising:

generating the second current while generating the first current.

18. The method of claim 15, wherein driving each SOT-MRAM cell in the first row into the writing mode comprises:

driving a write switching transistor in each SOT-MRAM cell in the first row into a conducting state, the write switching transistor having a channel thereof connected between a first terminal of the SOT conductor and a write bit line.

19. The method of claim 15, wherein driving each SOT-MRAM cell in the second row into the reading mode comprises:

driving a read switching transistor in each SOT-MRAM cell in the second row into a conducting state, the read switching transistor having a channel thereof connected between the MTJ structure and a read bit line.

20. The method of claim 15, further comprising:

driving each SOT-MRAM cell in remaining rows in the matrix into a detached mode, wherein driving each SOT-MRAM cell in remaining rows into the detached mode comprises driving a write switching transistor and a read switching transistor in each SOT-MRAM cell in remaining rows into a non-conducting state.

* * * * *